(12) United States Patent
Cohen

(10) Patent No.: US 8,816,891 B2
(45) Date of Patent: Aug. 26, 2014

(54) WIDE RANGE INPUT CURRENT CIRCUITRY FOR AN ANALOG TO DIGITAL CONVERTER

(71) Applicant: Microsemi Corp.—Analog Mixed Signal Group, Ltd., Hod Hasharon (IL)

(72) Inventor: Shimon Cohen, Burgata (IL)

(73) Assignee: Microsemi Corp.—Analog Mixed Signal Group, Ltd., Hod Hasharon (IL)

( * ) Notice: Subject to any disclaimer, the term of this patent is extended or adjusted under 35 U.S.C. 154(b) by 0 days.

(21) Appl. No.: 14/143,031

(22) Filed: Dec. 30, 2013

(65) Prior Publication Data

US 2014/0197975 A1  Jul. 17, 2014

Related U.S. Application Data

(60) Provisional application No. 61/753,453, filed on Jan. 17, 2013.

(51) Int. Cl.
*H03M 1/12* (2006.01)
*H03M 1/00* (2006.01)

(52) U.S. Cl.
CPC .. *H03M 1/12* (2013.01); *H03M 1/00* (2013.01)
USPC .......................................... 341/155; 341/156

(58) Field of Classification Search
CPC ................................. H03M 1/00; H03M 1/12
USPC .......................................... 341/155, 156, 120
See application file for complete search history.

(56) References Cited

U.S. PATENT DOCUMENTS

| 7,768,757 | B2* | 8/2010 | Koski ........................... 361/93.1 |
| 8,373,449 | B2 | 2/2013 | Thiele et al. |
| 2008/0030258 | A1 | 2/2008 | Komiya |

OTHER PUBLICATIONS

Greg Zimmer; "Two Current Sense Amps Solve Single Amp Limitations"; ECN Magazine Jul. 23, 2009, published on-line at www.ecnmag.com.
International Search Report for Parallel PCT application PCT/IL2013/051090 issued by the European Patent Office mailing date Apr. 4, 2014.
Written Opinion of the International Searching Authority for Parallel PCT application PCT/IL2013/051090 issued by the European Patent Office mailing date Apr. 4, 2014.

* cited by examiner

*Primary Examiner* — Joseph Lauture
(74) *Attorney, Agent, or Firm* — Simon Kahn

(57) ABSTRACT

An input circuitry for an ADC constituted of: a first resistor coupled to an input of the ADC; a second resistor coupled to the input of the ADC and arranged to provide a current path; an electronically controlled switch coupled to the first resistor and arranged to provide a parallel current path through the first resistor; and a control circuitry; wherein the control circuitry is arranged to operate in a high current mode in the event that the input current exhibits an intensity within a first predetermined range and is arranged to operate in a low current mode in the event that the input current exhibits an intensity within a second predetermined range, different than the first predetermined range, wherein, in the high current mode the control circuitry is arranged to close the electronically controlled switch and in the low current mode is arranged to open the electronically controlled switch.

15 Claims, 6 Drawing Sheets

| 2100 | LOW CURRENT MODE, E.G. CLASS, SS OPEN |
| 2110 | HIGH CURRENT MODE, E.G. OPERATING, CLOSE SS |

US 8,816,891 B2

WIDE RANGE INPUT CURRENT CIRCUITRY FOR AN ANALOG TO DIGITAL CONVERTER

TECHNICAL FIELD

The invention relates generally to the field of analog to digital converters and particularly to an input circuitry for an analog to digital converter arranged to receive a wide range of currents.

BACKGROUND

In many applications an electronic chip is provided to perform one or more functions, including the control of current provided to an external device, or load. In order to ensure proper powering of the external device, or load, the provided current should be measured. For example, Power over Ethernet (PoE), in accordance with both IEEE 802.3af-2003 and IEEE 802.3at-2009, each published by the Institute of Electrical and Electronics Engineers, Inc., New York, the entire contents of each of which is incorporated herein by reference, defines delivery of power over a set of 2 twisted wire pairs without disturbing data communication. The aforementioned standards particularly provide for a power sourcing equipment (PSE) and one or more powered devices (PD). In a first stage of operation, the PSE is arranged to output to each PD a class current, typically ranging from 0-50 mA, in order to determine the class of the PD. In the operating stage of operation, the PSE is arranged to output an operating current, typically ranging from 350 mA-1 A. In both stages, the current output by the PSE should be measured in order to determine if there is enough power for all of the PDs.

Unfortunately, analog to digital converters (ADCs) capable of properly converting such a wide range of currents add additional costs. There is thus a long felt need for an arrangement allowing for the conversion of a wide range of input currents by a standard ADC.

SUMMARY OF THE INVENTION

Accordingly, it is a principal object of the present invention to overcome the disadvantages of prior art ADC input circuitries. In one embodiment, a wide range input current circuitry for an analog to digital converter (ADC) is provided, the wide range input current circuitry comprising: a first resistor coupled to an input of the ADC; a first electronically controlled switch coupled to the first resistor; a second resistor coupled to the input of the ADC and arranged to provide a current path for an input current; a control circuitry in communication with the first electronically controlled switch and arranged to alternately open and close the first electronically controlled switch, wherein the control circuitry is arranged to operate in a high current mode in the event that the input current exhibits an intensity within a first predetermined range and is arranged to operate in a low current mode in the event that the input current exhibits an intensity within a second predetermined range, lower than the first predetermined range, wherein, in the high current mode, the control circuitry is arranged to close the first electronically controlled switch, the first electronically controlled switch arranged when closed to provide a current path for the input current through the first resistor, and wherein, in the low current mode, the control circuitry is arranged to open the first electronically controlled switch, the first electronically controlled switch arranged when opened to prevent the flow of the input current through the first resistor.

In one further embodiment, the circuitry further comprises a second electronically controlled switch coupled to the second resistor, wherein responsive to both the high current mode and low current mode of the control circuitry, the second electronically controlled switch is arranged to be closed, and wherein the ratio between the area of the first electronically controlled switch and the area of the second electronically controlled switch is equal to the ratio between the resistance of the second resistor and the resistance of the first resistor.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF THE PREFERRED EMBODIMENTS

Figure 1A:
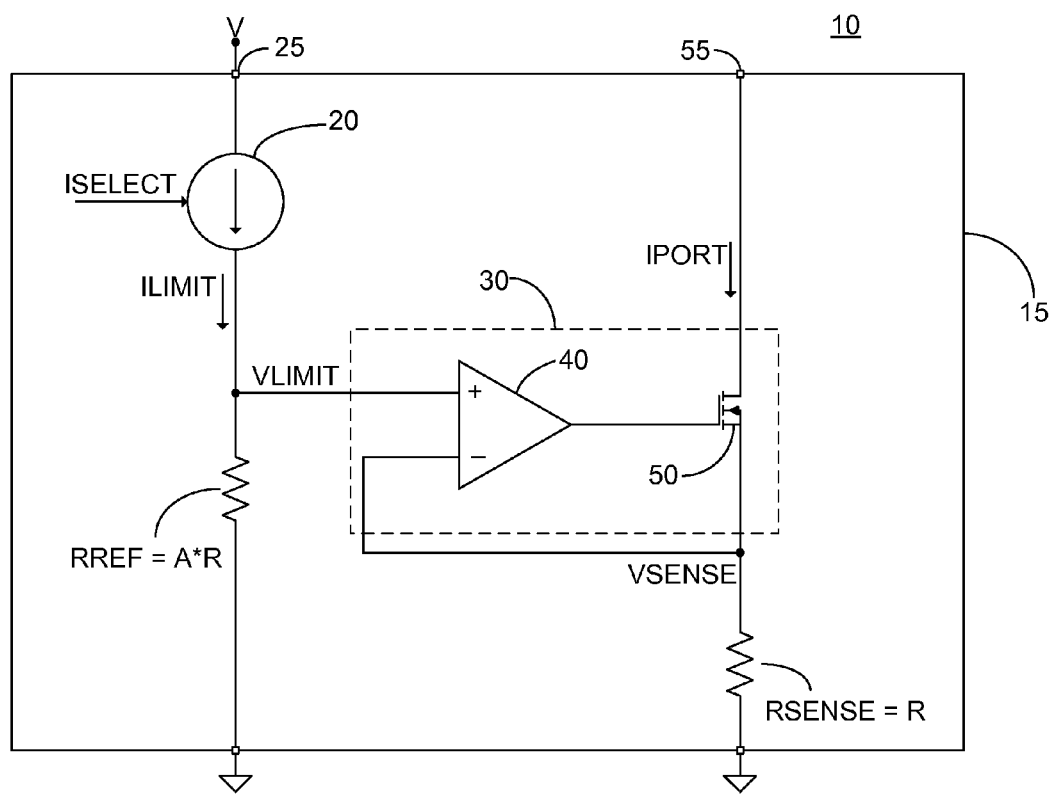
FIG. 1A illustrates a high level schematic diagram of an on-chip port current control arrangement utilizing a variable current source.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting. The term resistor as used herein refers to an element defined in an integrated circuit arranged to present resistance to a current flow there through.

FIG. 1A illustrates a high level schematic diagram of an on-chip port current control arrangement 10. Arrangement 10 comprises: an integrated circuit 15; a reference current source 20; a current control circuitry 30 comprising a differential amplifier 40 and an electronically controlled switch 50; an on-chip reference resistor, denoted RREF; and an on-chip sense resistor, denoted RSENSE. Reference current source 20 is preferably variable over a plurality of predetermined values, responsive to a control input, denoted ISELECT. In one embodiment, reference current source 20, current control circuitry 30, on-chip reference resistor RREF and on-chip sense resistor RSENSE are all defined on integrated circuit 15. In another embodiment, reference current source 20 is external of integrated circuit 15. In one embodiment, differential amplifier 40 comprises an operational amplifier. Electronically controlled switch 50 is arranged to adjust the intensity of current flowing there through responsive to the output of differential amplifier 40. Electronically controlled switch 50 is described below as being implemented as an n-channel metal-oxide field effect transistor (NMOSFET), however this is not meant to be limiting in any way and other electronically controlled switches arranged to adjust the intensity of current flowing therethrough may be provided. As described above, on-chip resistors, such as sense resistor RSENSE and reference resistor RREF, exhibit an approximately know resistance with a large tolerance due to manufacturing limitations. However, the ratio between the resistances of different resistors on a single electronic chip is known with a sufficient accuracy, and is temperature independent since any temperature dependent change in the resistors are in-step. The resistance of sense resistor RSENSE is denoted R and the resistance of reference resistor RREF is denoted A*R, where A is an accurately known predetermined constant such that the resistance of reference resistor RREF is given as a factor of the resistance of sense resistor RSENSE. There is no requirement that the value of A be greater than 1, and thus RREF may have a greater resistance that RSENSE, a resistance less than that of RSENSE or a resistance substantially equal to that of RSENSE without exceeding the scope. The resistances thus exhibit a predetermined relationship, preferably a predetermined fixed temperature independent mathematic relationship.

Reference resistor RREF is illustrated as being a single resistor in series with variable reference current source 20, however this is not meant to be limiting in any way. In another embodiment, as will be described further below in relation to FIG. 1B, reference current source 20 is fixed, and reference resistor RREF is constituted of a plurality of series connected resistors.

An input of reference current source 20 is coupled to a port 25 of integrated circuit 15 and port 25 is coupled to an external source voltage, denoted V. The amount of current generated by reference current source 20 is preferably controlled by input ISELECT. The output of reference current source 20, denoted ILIMIT, is coupled to a first end of reference resistor RREF and to the non-inverting input of differential amplifier 40 and a second end of reference resistor RREF is coupled to a common potential. The inverting input of differential amplifier 40 is coupled to a first end of sense resistor RSENSE and to the source of electronically controlled switch 50 and a second end of sense resistor RSENSE is coupled to the common potential. The output of differential amplifier 40 is coupled to the gate of electronically controlled switch 50 and the drain of electronically controlled switch 50 is coupled to a port 55 of integrated circuit 15. Port 55 carries the port current, i.e. the current to be measured and/or controlled.

In one non-limiting embodiment, port 55 is the negative leg of a PoE system, as described above in relation to IEEE 802.3 of or IEEE 802.3 at. In such an embodiment, the common potential is a return to a DC power source, typically at about −48V DC in relation to ground potential.

In operation, reference current source 20 is arranged to generate limit reference current ILIMIT, of a predetermined value. Limit reference current ILIMIT flows through reference resistor RREF and produces a limit voltage there across, the voltage denoted VLIMIT, which is received at the non-inverting input of differential amplifier 40. Port 55 is arranged to receive a port current, denoted IPORT. Current IPORT flows through electronically controlled switch 50 and sense resistor RSENSE to the common potential and produces a sensed voltage across sense resistor RSENSE, the sensed voltage denoted VSENSE. The difference between limit voltage VLIMIT and sensed voltage VSENSE is amplified by differential amplifier 40 and current IPORT is limited responsive to the output of differential amplifier 40. In particular, in the event that sensed voltage VSENSE is greater than limit voltage VLIMIT, the resistance of electronically controlled switch 50, i.e. the $RDS_{on}$ of electronically controlled switch 50 is increased thereby reducing port current IPORT. In the event that sensed voltage VSENSE is less than limit voltage VLIMIT, the $RDS_{on}$ of electronically controlled switch 50 is decreased thereby allowing for an increase in port current IPORT. The operation of current control circuitry 30 is thus arranged to cause sensed voltage VSENSE to be less than or equal to limit voltage VLIMIT, as known in the art. In certain embodiments sensed voltage VSENSE may be less than VLIMIT, such as when the circuitry attached to port 55 only passes a current less than A*ILIMIT. In such a case, electronically controlled switch 50 is fully on, i.e. $RDS_{on}$ is at its minimum responsive to the output of differential amplifier 40, however IPORT is limited by a load circuitry connected to port 55. Thus current control circuitry 30 acts as a current governor, wherein IPORT can not exceed A*ILIMIT, but in certain circumstances may be less than A*ILIMIT.

As will be described below, port current IPORT can thus be accurately controlled to not exceed a predetermined limit by selecting an appropriate limit reference current ILIMIT. In particular, EQ. 1 shows the relationship between port current IPORT and sense voltage VSENSE for a case wherein current is being limited by current control circuitry 30:

$$IPORT = VSENSE/R \qquad \text{EQ. 1}$$

where R is the resistance of sense resistor RSENSE, which as described above is unknown.

As described above, current control circuitry 30 is arranged to cause sense voltage VSENSE to be equal to reference voltage VLIMIT. Therefore, EQ. 1 can be rewritten as:

$$IPORT = VLIMIT/R \qquad \text{EQ. 2}$$

The relationship between reference voltage VLIMIT and limit reference current ILIMIT is given as:

$$VLIMIT = ILIMIT * A * R \qquad \text{EQ. 3}$$

where, as described above, R is the resistance of sense resistor RSENSE and A is a predetermined constant, A*R being the resistance of reference resistor RREF.

The combination of EQ. 2 and EQ. 3 provides the relationship between current port IPORT and limit reference current ILIMIT, which is independent of the unknown value R, as:

$$IPORT = ILIMIT*A \qquad \text{EQ. 4}$$

Thus, on-chip port current control arrangement 10 limits port current IPORT as a known function of limit reference current ILIMIT. Port current IPORT can thus be limited to a predetermined value by setting the value of limit reference current ILIMIT, without requiring precise knowledge of the value of RSENSE.

Figure 1B:
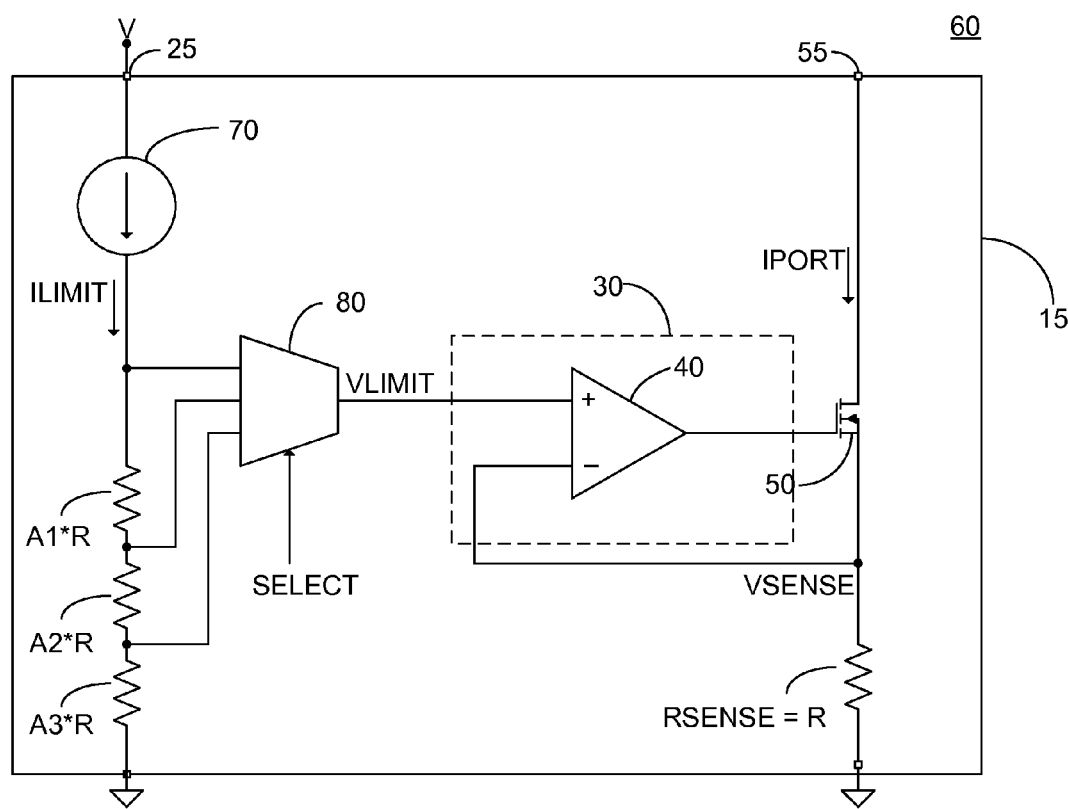
FIG. 1B illustrates a high level schematic diagram of an on-chip port current control arrangement utilizing a selectable reference resistor.

FIG. 1B illustrates a high level schematic diagram of an on-chip port current control arrangement 60 utilizing a selectable reference resistor. On-chip port current control arrangement 60 is in all respects identical with that of on-chip port current control arrangement 10, with the exception that a plurality of selectable reference resistors, of value A1*R; A2*R and A3*R are provided, the resistors being denoted by their values for simplicity. In particular, fixed current source 70 is provided in place of variable current source 20, and is arranged to provide a fixed current ILIMIT. The output of fixed current source 70 is coupled to a first end of resistor A1*R, and to a first input of a multiplexer 80. A second end of resistor A1*R is coupled to a second input of multiplexer 80 and to first end of resistor A2*R. A second end of resistor A2*R is coupled to a third input of multiplexer 80 and to a first end of resistor A3*R. A second end of resistor A3*R is coupled to the common potential. A select input is provided for multiplexer 80. The output of multiplexer 80 is denoted VLIMIT and is coupled to the non-inverting input of differential amplifier 40. Three reference resistors A1*R; A2*R and A3*R are illustrated, however this is not meant to be limiting in any way, and any number of reference resistors may be provided without exceeding the scope.

In operation, input SELECT determines the resistance experienced by ILIMIT, and thus VLIMIT. Port current IPORT is again limited responsive to A, which may be a linear combination of A1, A2, A3 as selected by multiplexer 80 responsive to input select. Thus, with a single fixed reference current source 70 a plurality of values for VLIMIT may be generated of a fixed ratio between them, responsive to the ratio of the constituent resistors forming reference resistor RREF, thus allowing for a plurality of current limits to be set for current control circuitry 30.

The above is illustrated in an embodiment wherein reference resistors A1*R, A2*R and A3*R are serially connected, however this is not meant to be limiting in any way, and parallel connections may implemented without exceeding the scope.

Figure 2A:
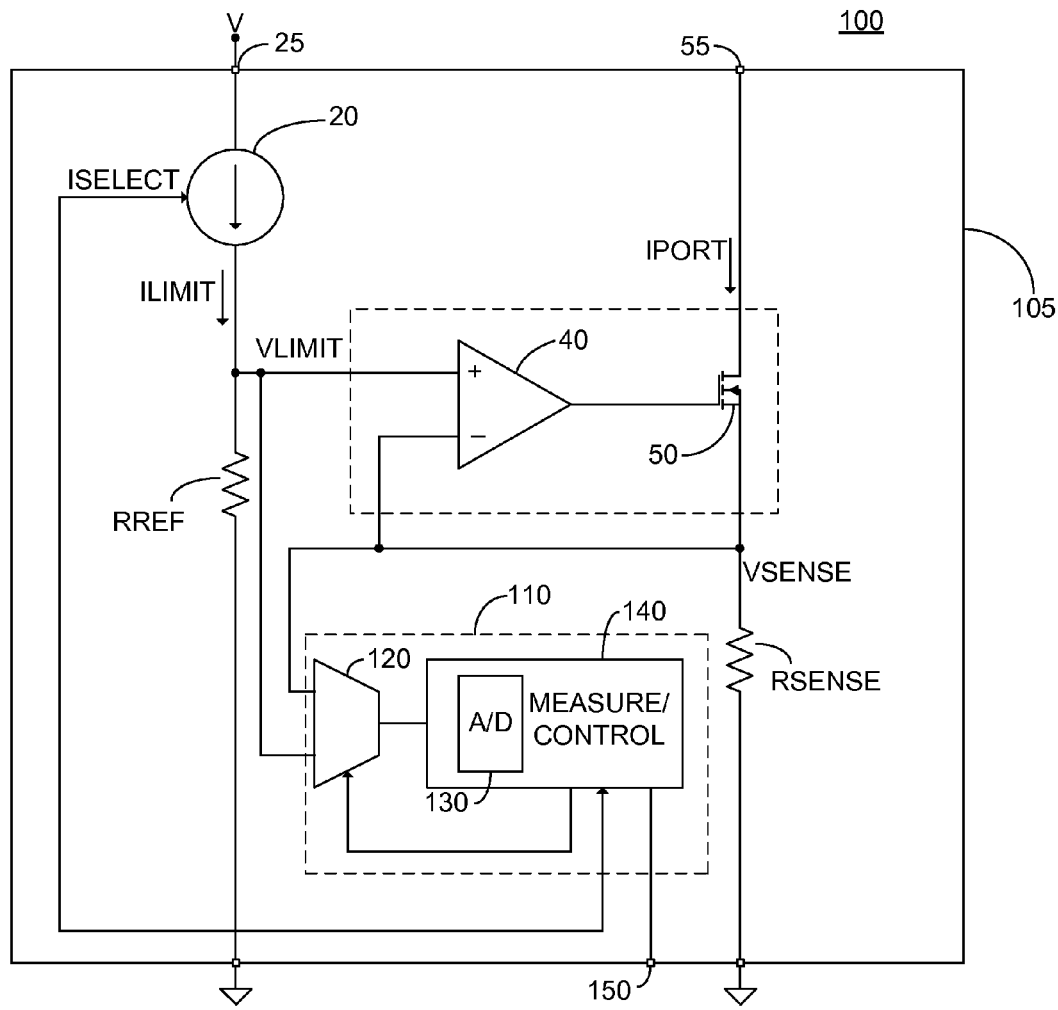
FIG. 2A illustrates a high level schematic diagram of the on-chip port current control arrangement of FIG. 1 further comprising a port current determining circuitry.

FIG. 2A illustrates a high level schematic diagram of an on-chip port current control arrangement 100, which further provides for precise measurement of actual port current IPORT. On-chip port current control arrangement 100 comprises: an integrated circuit 105; a port current measuring circuitry 110; a reference current source 20; on-chip reference resistor RREF; on-chip sense resistor RSENSE; and current control circuitry 30 comprising differential amplifier 40 and electronically controlled switch 50. Port current measuring circuitry 110 comprises: a multiplexer 120; and a current measuring circuitry control 140, comprising therein an analog to digital converter (ADC) 130. In one embodiment, reference current source 20, on-chip reference resistor RREF, on-chip sense resistor RSENSE and port current measuring circuitry 110 are all defined on integrated circuit 105. In another embodiment, reference current source 20 is external of integrated circuit 105. As described above, on-chip resistors, such as sense resistor RSENSE and reference resistor RREF, exhibit an approximately known resistance with a large tolerance due to manufacturing limitations. However, the ratio between the resistances of different resistors on a single electronic integrated circuit area is known with a sufficient accuracy. The resistance of sense resistor RSENSE is denoted R and the resistance of reference resistor RREF is denoted A*R, where A is an accurately known predetermined constant such that the resistance of reference resistor RREF is given as a multiple of the resistance of sense resistor RSENSE, as described above in relation to FIGS. 1A, 1B. The embodiment of port current control arrangement 10 of FIG. 1A is illustrated for convenience, however port current control arrangement 60 of FIG. 1B may implemented without exceeding the scope.

ADC 130 is shown integrated within current measuring circuitry control 140, however this is not meant to be limiting in any way. ADC 130 may be provided within multiplexer 120, separate ADC units may be provided ahead of multiplexer 120 for each of the inputs, or ADC 130 may not be provided at all, without exceeding the scope.

An input of reference current source 20 is coupled to a port 25 of integrated circuit 105 and port 25 is coupled to an external source voltage, denoted V. The output of reference current source 20 is coupled to a first end of reference resistor RREF, to a first input of multiplexer 120 and to the non-inverting input of differential amplifier 40 of current control circuitry 30. A second end of reference resistor RREF is coupled to a common potential. A first end of sense resistor RSENSE is coupled to port 55 of integrated circuit 105, to a second input of multiplexer 120 and to the inverting input of differential amplifier 40. A second end of sense resistor RSENSE is coupled to the common potential. An output of multiplexer 120 is coupled to an input of current measuring circuitry control 140, particularly to an input of ADC 130. A first output of current measuring circuitry control 140 is coupled to a control input of multiplexer 120 and a second output of current measuring circuitry control 140 is coupled to a port 150 of integrated circuit 105. Input ISELECT is connected to each of a control input of reference current source 20 and measuring circuitry control 140. Additionally, a fixed multiplier may be provided between multiplexer 120 and ADC 130 without exceeding the scope.

Figure 2B:
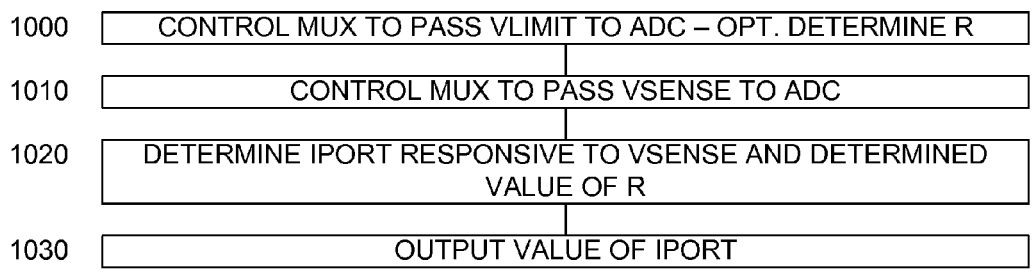
FIG. 2B illustrates a high level flow chart of the method of operation of the port current determining circuitry of FIG. 2A.

FIG. 2B illustrates a high level flow chart of a method of operation of port current measuring circuitry 110 of FIG. 2A, the figures being described together. As described above, a reference voltage VLIMIT is produced across on-chip reference resistor RREF responsive to a predetermined value of ILIMIT, and in stage 1000 current measuring circuitry control 140 is arranged to control multiplexer 120 to pass reference voltage VLIMIT to ADC 130 of current measuring circuitry control 140. ADC 130 is arranged to convert reference voltage VLIMIT to a digital signal reflecting the value of VLIMIT. As described above the value of RREF is not known with precision, only the ratio between RREF and RSENSE, namely A is known. Additionally, responsive to various factors, such as temperature, the value of RREF and RSENSE may fluctuate, however ratio A between them remains constant, and as indicated above is known factor.

Utilizing EQ. 3 above, current measuring circuitry control 140 optionally determines R, i.e. the actual resistance of RSENSE, as:

$$R = VLIMIT/(ILIMIT*A) \qquad \text{EQ. 5}$$

There is no requirement that R be actually determined, as will be explained further below.

In stage 1010 current measuring circuitry control 140 is arranged to control multiplexer 120 to pass sense voltage VSENSE to ADC 130. ADC 130 is arranged to convert sense voltage VSENSE to a digital signal and pass the digital signal to current measuring circuitry control 140.

In stage 1020, current measuring circuitry control 140 is arranged to determine port current IPORT responsive to the sense voltage VSENSE of stage 1010 and the determined R of stage 1000 as:

$$IPORT = VSENSE/R \qquad \text{EQ. 6}$$

Thus, responsive to the measurement of VLIMIT, an accurate measure of IPORT is determined by current measuring circuitry control 140. Alternately, by combining EQ. 6 with EQ. 5, IPORT may be determined without determination of R as:

$$IPORT = VSENSE*ILIMIT*A/VLIMIT \qquad \text{EQ. 7}$$

In stage 1030, the measured value of port current IPORT is output via port 150 of integrated circuit 105.

In one embodiment, stage 1000 is run periodically so as to update the value of R to take into account temperature effects. In another embodiment, stage 1000 is run responsive to a detected change in the temperature of integrated circuit 105. Stages 1010-1030 are run continuously so as to provide accurate measurement of IPORT.

Thus, the circuitry and method of FIGS. 2A-2B cooperate to determine the actual value of RSENSE, and the resultant actual value of IPORT. Such a value of IPORT is preferable for accurate reporting of power usage, and thus control of overall power usage, without limitation.

Figure 3:
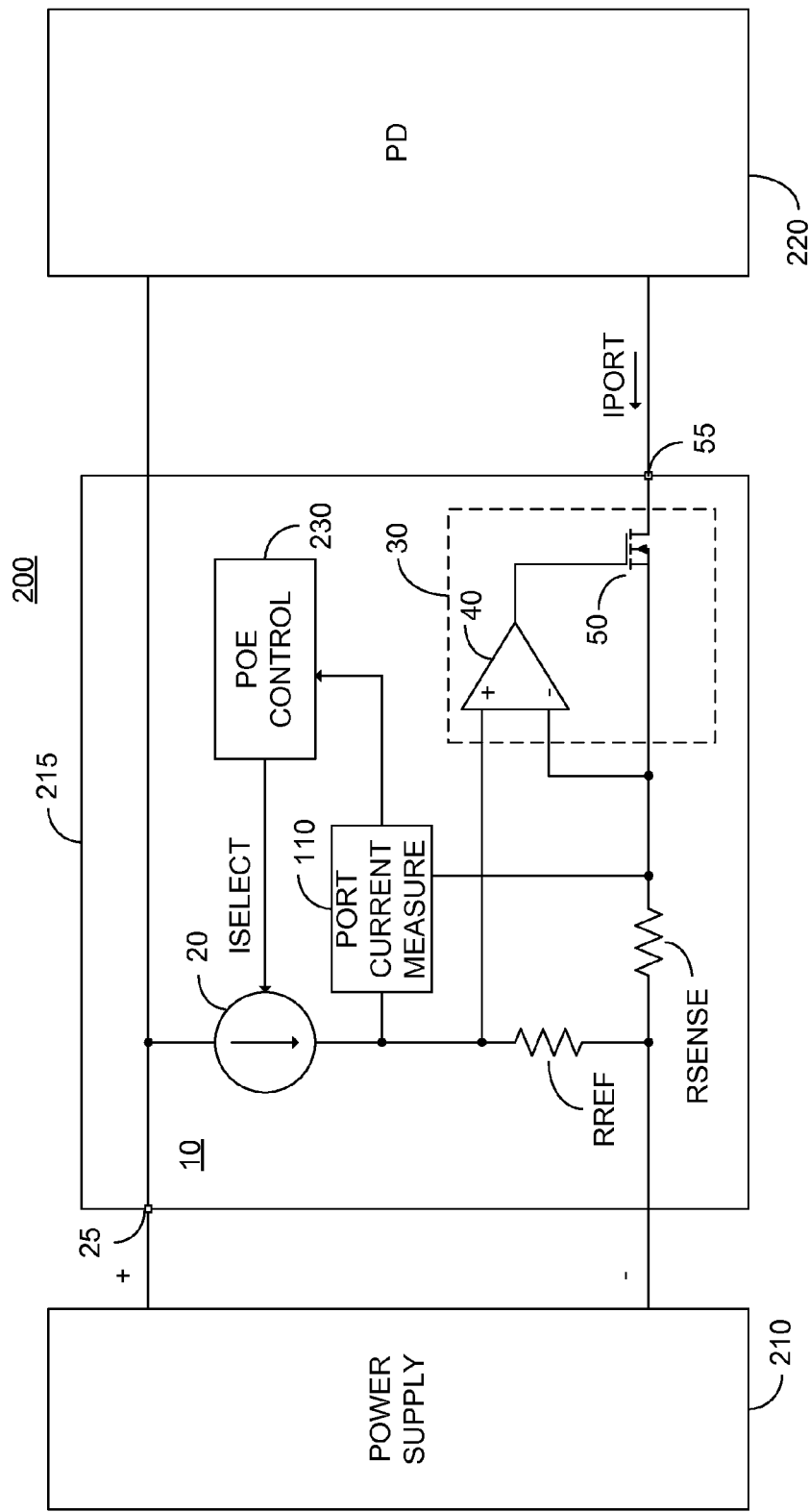
FIG. 3 illustrates a high level block diagram of a PoE system utilizing the on-chip port current control arrangement of FIG. 1.

FIG. 3 illustrates a high level block diagram of a PoE system 200 utilizing on-chip port current control arrangement 10 of FIG. 1. In particular PoE system 200 comprises a power supply 210, a powered device 220 and an integrated circuit 215, particularly a PoE controller. PoE controller 215 comprises reference current source 20; ports 25 and 55; resistors RREF and RSENSE; current control circuitry 30; port current measuring circuitry 110; and PoE control circuitry 230. The positive output of power supply 210 is coupled to PD 220 via port 25, and is further coupled to the first end of reference current source 20. The second end of reference current source 20 is coupled to an input of port current measuring circuitry 110, to a first end of reference resistor RREF and to a first input of current control circuitry 30, particularly to the non-inverting input of differential amplifier 40 thereof. The second end of on-chip reference resistor RREF is coupled to the return of power supply 210 and to the second end of on-chip sense resistor RSENSE. The first end of on-chip sense resistor RSENSE is coupled to a second input of current control circuitry 30, particularly to the inverting input of differential amplifier 40 thereof, to the source of electronically controlled switch 50 of current control circuitry 30 and to a second input of port current measuring circuitry 110. The output of difference amplifier 40 is coupled to the gate of electronically controlled switch 50, and the drain of electronically controlled switch 50 is coupled to the return from PD 220 via port 55. The output of port current measuring circuitry 110 is coupled to an input of PoE control circuitry 230, and an output of PoE control circuitry 230, denoted ISELECT is coupled to the control input of reference current source 20.

In operation, PoE system 200 provides power from power supply 210 to PD 200 over a twisted wire pair connection, as described in the above mentioned standards. The return current, denoted IPORT, as described above, is received at port 55, and is controlled, and particularly limited to a value, by the value of the current output by reference current source 20. Accurate reporting of the current through port 55 is accomplished by port current measuring circuitry 110. Optionally, an additional port 50 is provided (not shown) to provide information regarding the determined port current to other circuitry.

Figures 4A, 4B:
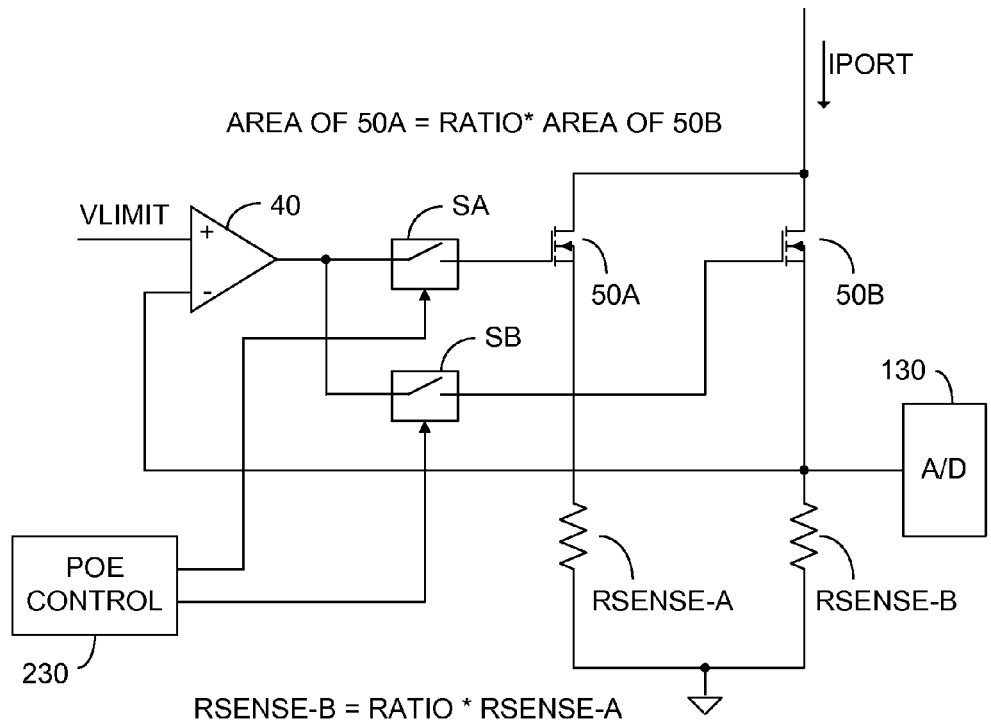
FIG. 4A illustrates a high level block diagram of an on-chip port current control arrangement, wherein a single A/D is arranged to handle a broad range of current control levels.
FIG. 4B illustrates a high level flow chart of the method of operation of the on-chip port current control arrangement of FIG. 4A.

FIG. 4A illustrates a high level block diagram of an on-chip port current control arrangement 300 wherein a single ADC 130 is arranged to handle a broad range of current control levels, the current levels determined responsive to VLIMIT. Current control arrangement 300 comprises: differential amplifier 40; a first electronically controlled switch SA; a second electronically controlled switch SB; PoE control circuitry 230; a first NMOSFET 50A; a second NMOSFET 50B; a first sense resistor RSENSE-A; and a second sense resistor RSENSE-B. First NMOSFET 50A and second NMOSFET 50B are specific implementations of general electronically controlled switches, and are not restricted to NMOSFETs. Similarly, PoE control 230 is an embodiment of a general control circuitry, and is not meant to be limited to the specific art of PoE. The teachings herein are applicable to any circuitry wherein current limits are to be applied, and a broad range of currents are to be measured.

Limit voltage VLIMIT, which as described above may be set responsive to an output of PoE control 230, is coupled to the non-inverting input of differential amplifier 40. The output of differential amplifier 40 is coupled to a first terminal of first electronically controlled switch SA and to a first terminal of second electronically controlled switch SB. A second terminal of first electronically controlled switch SA is coupled to the gate of first NMOSFET 50A and a second terminal of second electronically controlled switch SB is coupled to the gate of second NMOSFET 50B. The drains of each of first and second NMOSFETs 50A, 50B are commonly coupled to port 55, and current IPORT flows through port 55.

The source of first NMOSFET 50A is coupled to a first end of first sense resistor RSENSE-A. The source of second NMOSFET 50B is coupled to a first end of second sense resistor RSENSE-B, to the input of ADC 130 and to the inverting input of differential amplifier 40. A second end of each of first sense resistor RSENSE-A and second sense resistor RSENSE-B is coupled to a common potential, which in the embodiment of FIG. 3 is the return of power supply 210. Respective outputs of PoE control circuitry 230 are coupled to the control inputs of first electronically controlled switch SA and second electronically controlled switch SB. Multiplexer 120 of FIG. 2A is not shown for ease of understanding.

The ratio of the resistance of second sense resistor RSENSE-B to the resistance of first sense resistor RSENSE-A is set to a predetermined value, denoted RATIO, which is greater than 1. Thus, the resistance of first sense resistor RSENSE-A is less than the resistance of second resistor RSENSE-B. In one particular embodiment, which will be used for illustration purposes, the resistance of first sense resistor RSENSE-A is 0.114 ohms, and the resistance of second sense resistor RSENSE-B is 0.8 ohms, and thus RATIO is equal to 7. First NMOSFET 50A is constituted of an NMSOFET with a first area, denoted AREA-A and second NMOSFET 50B is constituted of an NMSOFET with a second area, denoted AREA-B. The relationship between AREA-B and AREA-A is set to 1/RATIO, in the illustrative example AREA-B is thus 1/7 of AREA-A. Thus, the relationship between the combined on-resistance of first NMOSFET 50A and first sense resistor RSENSE-A to the combined on-resistance of second NMOSFET 50B and second sense resistor RSENSE-B is determined by RATIO, and is independent of temperature factors.

FIG. 4B illustrates a high level block diagram of the method of operation of the on-chip port current control arrangement of FIG. 4A, FIGS. 4A and 4B being described together for clarity. In stage 2000, in order to control and measure a low current, such as a class current of PoE, PoE control circuitry 230 operates in a low current mode. In the low current mode PoE control circuitry 230 closes second electronically controlled switch SB, and sets first electronically controlled switch SA to be open. Current IPORT thus flows only through second NMOSFET 50B and through second sense resistor RSENSE-B, and develops VSENSE across second sense resistor RSENSE-B. For the illustrative example of classification of PoE currents, which are restricted to the range of 0-50 mA, voltage VSENSE presented to ADC 130 is thus in the range of up to 40 mV. Thus, second NMOSFET 50B and second sense resistor RSENSE-B present a single current path for current IPORT.

In stage 2010, in order to control operating currents, which in the illustrative example of PoE, may range from 350 mA-1 A, PoE control circuitry 230 operates in a high current mode. In the high current mode PoE control circuitry 230 closes first and second electronically controlled switches SA and SB. First sense resistor RSENSE-A is thus in parallel with second sense resistor RSENSE-B. A first portion of current IPORT flows through a parallel current path presented by the serial combination of first NMOSFET 50A and first sense resistor RSENSE-A and a second portion of current IPORT flows through the serial combination of second NMOSFET 50B and second sense resistor RSENSE-B as described above in relation to the low current mode. Since the ratio of the area of second NMOSFET 50B to first NMOSFET 50A is inversely proportional to the ratio of second sense resistor RSENSE-B to first sense resistor RSENSE-A, i.e. RATIO, the current flow through the legs are similarly responsive to RATIO. First sense resistor RSENSE-A and second sense resistor RSENSE-B are effectively in parallel, and current IPORT flows through first sense resistor RSENSE-A and second sense resistor RSENSE-B in an amount responsive to RATIO. In particular, the current through second sense resistor RSENSE-B, which develops VSENSE is IPORT/(RATIO+1). By utilizing RATIO to determine both the areas of first NMOSFET 50A and second NMOSFET 50 as well as the resistances of first sense resistor RSENSE-A and second sense resistor RSENSE-B, the current is properly divided between the legs irrespective of temperature, since the resistance, and on-resistances, are at fixed ratios.

For the illustrative example of PoE, where RATIO=7, and RSENSE-A=0.8 ohms, and the current through IPORT is in the range of 350 mA to 1 A, VSENSE ranges from 35 mV to 100 mV, which is easily achievable by a standard ADC with a multiplier as part of the front end of the ADC (multiplier not shown).

Figures 5A, 5B:
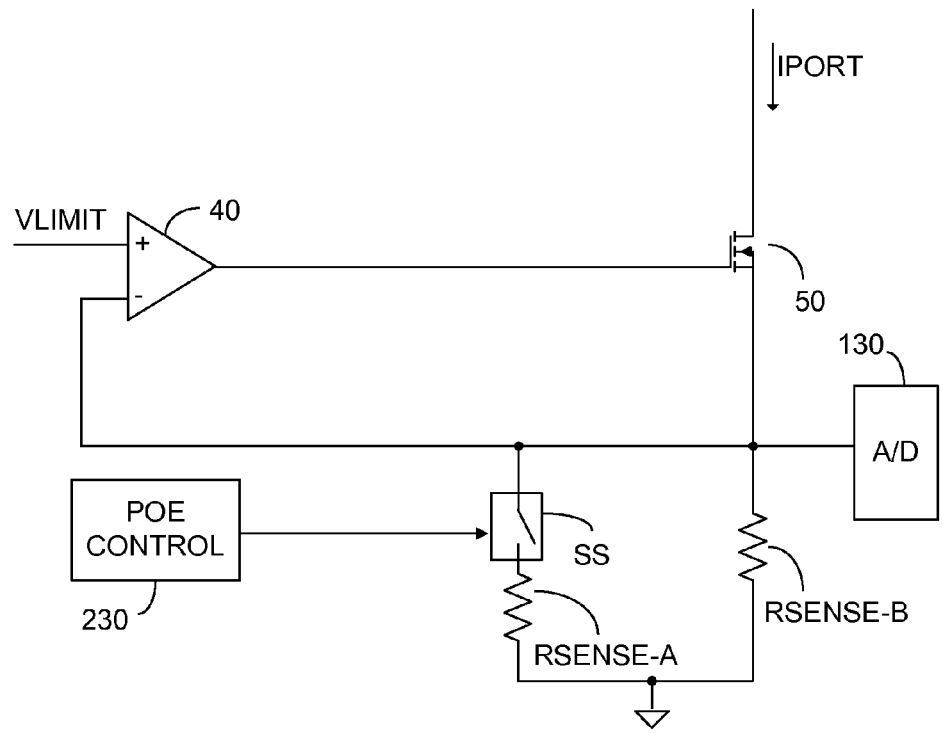
FIG. 5A illustrates a high level block diagram an input circuit for an single A/D such that the single A/D is arranged to handle a broad range of current control levels.
FIG. 5B illustrates a high level flow chart of the method of operation of the A/D input circuit of FIG. 5A.

FIG. 5A illustrates a high level block diagram of an input circuit 400 for a single ADC 130, wherein ADC 130 is arranged to handle a broad range of current control levels, as described above in relation to FIGS. 4A and 4B. Input circuit 400 comprises: differential amplifier 40; an electronically controlled switch 50; an electronically controlled switch SS; PoE control circuitry 230; a first sense resistor RSENSE-A; and a second sense resistor RSENSE-B. Electronically controlled switch 50 is implemented in one non-limiting embodiment as an NMOSFET, however this is not meant to be limiting in any. Similarly, PoE control circuitry 230 is an embodiment of a general control circuitry, and is not meant to be limited to the specific art of PoE. The teachings herein are applicable to any circuitry wherein current limits are to be applied, and a broad range of currents are to be measured.

Limit voltage VLIMIT, which as described above may be set responsive to an output of PoE control 230, is coupled to the non-inverting input of differential amplifier 40. The output of differential amplifier 40 is coupled to the gate of electronically controlled switch 50. The inverting input of differential amplifier 40 is coupled to a first terminal of electronically controlled switch SS, to the source of electronically controlled switch 50, to a first end of second sense resistor RSENSE-B and to the input of ADC 130. A second terminal of electronically controlled switch SS is coupled to a first end of first sense resistor RSENSE-A and a control terminal of electronically controlled switch SS is coupled to an output of PoE control circuitry 230. A second end of first sense resistor RSENSE-A and second sense resistor RSENSE-B are each coupled to a common potential point. The drain of electronically controlled switch 50 is coupled to port 55 (not shown), and IPORT flows through port 55.

As described above, the ratio of the resistance of second sense resistor RSENSE-B to the resistance of first sense resistor RSENSE-A is set to a predetermined value, denoted RATIO2, which is greater than 1. Thus, the resistance of second sense resistor RSENSE-B is greater than the resistance of first resistor RSENSE-A. The on-resistance of electronically controlled switch SS is assumed to be negligible, and thus does not affect current flow.

FIG. 5B illustrates a high level block diagram of the method of operation of the input circuit of FIG. 5A, FIGS. 5A and 5B being described together for clarity. In stage 2100, in order to control and measure a low current, such as a class current of PoE which is restricted to the range of 0-50 mA, PoE control circuitry 230 operates in a low current mode. In the low current mode PoE control circuitry 230 sets electronically controlled switch SS to be open. Current IPORT thus flows only through electronically controlled switch 50 and through the single current path presented by second sense resistor RSENSE-B, and develops VSENSE across second sense resistor RSENSE-B.

In stage 2110, in order to control operating currents, which in the illustrative example of PoE, may range from 350 mA-1 A, PoE control circuitry 230 operates in a high current mode. In the high current mode PoE control circuitry 230 closes electronically controlled switch SS. First sense resistor RSENSE-A is thus in parallel with second sense resistor RSENSE-B, and a first portion of current IPORT flows through a parallel current path presented by first sense resistor RSENSE-A and a second potion flows through the current path presented by second sense resistor RSENSE-B as described above in relation to the low current mode. Since first sense resistor RSENSE-A and second sense resistor RSENSE-B are coupled in parallel, VSENSE is thus smaller than if electronically controlled switch SS is open and first sense resistor RSENSE-A is not coupled to second sense resistor RSENSE-B. Therefore, as described above in relation to FIGS. 4A-4B, in both the low current mode and the high current mode VSENSE is within a range easily achievable by a single standard ADC. As described above, differential amplifier 40 is arranged to control current IPORT by adjusting the gate voltage of electronically controlled switch 50.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

The terms "include", "comprise" and "have" and their conjugates as used herein mean "including but not necessarily limited to".

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

The invention claimed is:

1. A wide range input current circuitry for an analog to digital converter (ADC), the wide range input current circuitry comprising:
   a port for receiving an input current;
   a control circuitry;
   a first resistor having a first resistance;
   a first electronically controlled switch arranged to couple, responsive to said control circuitry, said port to said first resistor so as to provide a first current path for a first portion of the received input current, said first electronically controlled switch having a first area;
   a second resistor having a second resistance, said second resistor coupled to the input of the ADC; and
   a second electronically controlled switch arranged to couple said port to said second resistor so as to provide a second current path for a second portion of the received input current, said second electronically controlled switch having a second area,
   wherein the ratio between the first area and the second area is equal to the ratio between the second resistance and the first resistance,
   wherein said control circuitry is arranged to operate in a high current mode in the event that the input current exhibits an intensity within a first predetermined range and is arranged to operate in a low current mode in the event that the input current exhibits an intensity within a second predetermined range, said second predetermined range lower than the first predetermined range,
   wherein in said high current mode said control circuitry is arranged to close said first electronically controlled switch so as to couple said port to said first resistor and thereby provide the first current path for the first portion of the received input current, and
   wherein in said low current mode said control circuitry is arranged to open said first electronically controlled switch, said first electronically controlled switch arranged when opened to prevent the flow of the first portion of the received input current through said first resistor.

2. The circuitry of claim 1, wherein said second electronically controlled switch is responsive to said control circuitry.

3. The circuitry of claim 1, wherein a first end of said first resistor is coupled to a first terminal of said first electronically controlled switch, a first end of said second resistor is coupled to a first terminal of said second electronically controlled switch and a second terminal of said first electronically controlled switch is coupled to a second terminal of said second electronically controlled switch,
   wherein the common node of said second resistor and said second electronically controlled switch is coupled to the input of the ADC, and
   wherein the second terminal of said first electronically controlled switch and the second terminal of said second electronically switch are commonly coupled to said port.

4. The circuitry of claim 3, further comprising a differential amplifier, a first input of said differential amplifier coupled to a reference voltage, a second input of said differential amplifier coupled to the common node of said second resistor and said second electronically controlled switch and the output of said differential amplifier coupled to a control input of each of said first electronically controlled switch and said second electronically controlled switch,
   wherein the output of said differential amplifier is arranged to control the amount of current flowing through each of said first electronically controlled switch and said second electronically controlled switch responsive to the difference between the reference voltage and the voltage across said second resistor.

5. The circuitry of claim 1, wherein said second electronically controlled switch is responsive to said control circuitry,
   wherein said control circuitry is arranged in both said high current mode and low current mode to close said second electronically controlled switch,
   wherein a first end of said first resistor is coupled to a first terminal of said first electronically controlled switch, a first end of said second resistor is coupled to a first terminal of said second electronically controlled switch and a second terminal of said first electronically controlled switch is coupled to a second terminal of said second electronically controlled switch,
   wherein the common node of said second resistor and said second electronically controlled switch is coupled to the input of the ADC, and
   wherein the second terminal of said first electronically controlled switch and the second terminal of said second electronically switch are commonly coupled to said port.

6. A method of providing a wide range of input currents for an analog to digital converter (ADC), the method comprising:
   in the event that an input current exhibits an intensity within a first predetermined range, providing
      a first current path for the input current through a first resistor, the first resistor having a first resistance, said first current path provided via a first electronically controlled switch having a first area, and
      a second current path through a second resistor, the second resistor having a second resistance, said second current path provided via a second electronically controlled switch having a second area, the second resistor coupled to an input of the ADC, said first current path parallel to said second current path; and
   in the event that the input current exhibits an intensity within a second predetermined range, lower than the first predetermined range, providing the second current path for the input current through the second resistor and not providing the first current path,
   wherein the ratio between the area of the first electronically controlled switch and the area of the second electronically controlled switch is equal to the ratio between the second resistance and the first resistance.

7. The method of claim 6, wherein said providing the first current path through the first resistor comprises closing said first electronically controlled switch, and
wherein said providing the second current path through the second resistor comprises closing said second electronically controlled switch.

8. The method of claim 6, wherein a first end of the first resistor is coupled to a first terminal of the first electronically controlled switch, a first end of the second resistor is coupled to a first terminal of the second electronically controlled switch and a second terminal of the first electronically controlled switch is coupled to a second terminal of the second electronically controlled switch,
wherein the common node of the second resistor and the second electronically controlled switch is coupled to the input of the ADC, and
wherein the second terminal of the first electronically controlled switch and the second terminal of the second electronically switch are commonly coupled to receive the input current.

9. The method of claim 8, further comprising controlling the amount of current flowing through each of the first electronically controlled switch and the second electronically controlled switch responsive to the difference between the voltage across the second resistor and a reference voltage.

10. The method of claim 6, wherein said providing said first current path through the first resistor comprises closing said first electronically controlled switch,
wherein said providing the current path through the second resistor comprises closing said second electronically controlled switch,
wherein a first end of the first resistor is coupled to a first terminal of the first electronically controlled switch, a first end of the second resistor is coupled to a first terminal of the second electronically controlled switch and a second terminal of the first electronically controlled switch is coupled to a second terminal of the second electronically controlled switch,
wherein the common node of the second resistor and the second electronically controlled switch is coupled to the input of the ADC, and
wherein the second terminal of the first electronically controlled switch and the second terminal of the second electronically switch are commonly coupled to receive the input current.

11. A wide range input current circuitry for an analog to digital converter (ADC), the wide range input current circuitry comprising:
a means for receiving an input current;
a control means;
a first means for providing electrical resistance having a first resistance;
a first field effect transistor (FET) arranged to couple, responsive to said control circuitry, said means for receiving to said first means for providing electrical resistance so as to provide a first current path for a first portion of the received input current, said first FET having a first area;
a second means for providing electrical resistance, having a second resistance, coupled to the input of the ADC; and
a second FET arranged to couple said port to said means for receiving to said second means for providing electrical resistance so as to provide a second current path for a second portion of the received input current, said second FET having a second area;
wherein the ratio between the first area and the second area is equal to the ratio between the second resistance and the first resistance,
wherein said control means is arranged to operate in a high current mode in the event that the input current exhibits an intensity within a first predetermined range and is arranged to operate in a low current mode in the event that the input current exhibits an intensity within a second predetermined range, lower than the first predetermined range,
wherein in said high current mode said control circuitry is arranged to close said first FET thereby providing the second current path parallel to the first current path, and
wherein in said low current mode said control circuitry is arranged to open said first FET thereby preventing the presentation of the second current path parallel to the first current path.

12. The circuitry of claim 11,
wherein, responsive to both the high current mode and low current mode of said control circuitry, said control means is arranged to close said second FET so as to provide the first current path.

13. The circuitry of claim 11, wherein a first end of said first means for providing an electrical resistance is coupled to a first terminal of said first FET, a first end of said second means for providing an electrical resistance is coupled to a first terminal of said second FET and a second terminal of said first FET is coupled to a second terminal of said second FET,
wherein the common node of said second means for providing electrical resistance and said second FET is coupled to the input of the ADC, and
wherein the second terminal of said first FET and the second terminal of said second FET are arranged to receive the input current.

14. The circuitry of claim 13, further comprising a means for amplifying a voltage difference, a first input of said means for amplifying a voltage difference coupled to a reference voltage, a second input of said means for amplifying a voltage difference coupled to the common node of said second means for providing electrical resistance and said second FET and the output of said means for amplifying a voltage difference coupled to a control input of each of said first FET and said second FET,
wherein the output of said means for amplifying a voltage difference is arranged to control the amount of current flowing through each of said first FET and said second FET responsive to the difference between the reference voltage and the voltage across said second means for providing electrical resistance.

15. The circuitry of claim 11,
wherein said control means is arranged in both said high current mode and low current mode to close said second FET to thereby provide the second current path for the input current through said second means for providing electrical resistance,
wherein a first end of said first means for providing an electrical resistance is coupled to a first terminal of said first FET, a first end of said second means for providing an electrical resistance is coupled to a first terminal of said second FET and a second terminal of said first FET is coupled to a second terminal of said second FET,
wherein the common node of said second means for providing electrical resistance and said second FET is coupled to the input of the ADC, and wherein the second terminal of said first FET and the second terminal of said second FET are commonly coupled to receive the input current.

* * * * *